US005522911A

United States Patent [19]

Terneu et al.

[11] Patent Number: 5,522,911
[45] Date of Patent: Jun. 4, 1996

[54] DEVICE AND METHOD FOR FORMING A COATING BY PYROLYSIS

[75] Inventors: Robert Terneu, Thiméon; Secondo Franceschi, Gosselies, both of Belgium

[73] Assignee: Glaverbel, Brussels, Belgium

[21] Appl. No.: 178,844

[22] Filed: Jan. 6, 1994

[30] Foreign Application Priority Data

Jan. 11, 1993 [GB] United Kingdom ............... 9300400

[51] Int. Cl.$^6$ ........................... C03C 17/09; C23C 16/06; B05B 15/04
[52] U.S. Cl. ................... 65/27; 65/60.1; 65/60.5; 65/60.52; 65/157; 65/168; 65/355; 118/718; 118/326; 427/252; 427/255; 427/255.5
[58] Field of Search ............................ 65/27, 60.1, 60.4, 65/60.5, 60.51, 60.52, 168, 375, 355, 30.1, 157; 118/718, 70, 326, 506; 427/252, 255.5, 255

[56] References Cited

U.S. PATENT DOCUMENTS

| | | | |
|---|---|---|---|
| 3,597,178 | 8/1971 | Tilton | 65/168 |
| 3,837,832 | 9/1974 | Pecoraro et al. | 65/27 |
| 4,123,244 | 10/1978 | Leclercq et al. | 65/60.52 |
| 4,329,379 | 5/1982 | Terneu et al. | 65/60.5 |
| 4,469,045 | 9/1984 | Chesworth | 65/60.5 |
| 4,857,097 | 8/1989 | Berry | 65/60.52 |
| 5,022,905 | 6/1991 | Grundy et al. | 65/60.52 |
| 5,089,039 | 2/1992 | Terneu et al. | 65/60.5 |

FOREIGN PATENT DOCUMENTS

| | | |
|---|---|---|
| 2348166 | 11/1977 | France . |
| 2648453 | 12/1990 | France . |
| 1506668 | 4/1978 | United Kingdom . |
| 1524326 | 9/1978 | United Kingdom . |
| 2033374 | 5/1980 | United Kingdom . |
| 2234264 | 1/1991 | United Kingdom . |
| 2247691 | 3/1992 | United Kingdom . |
| 91/13184 | 9/1991 | WIPO . |

*Primary Examiner*—David L. Lacey
*Assistant Examiner*—Steven P. Griffin
*Attorney, Agent, or Firm*—Spencer & Frank

[57] ABSTRACT

A device for the formation, by pyrolysis, of a coating of metal or a metal compound on one face of a hot glass substrate which is in motion by bringing the face into contact with a gaseous reagent includes a roof; support device for conveying the hot glass substrate along a path through a coating chamber defined between the roof and the face of the hot glass substrate; at least one reagent gas inlet in the form of a slot opening directly into the coating chamber and extending transverse to the path of the hot glass substrate for supplying and distributing gaseous reagent to the coating chamber; and at least one exhaust gas outlet for discharging exhaust gas from the coating chamber. At least during operation of the device a movable shield device is positioned in the coating chamber adjacent the roof thereof, and, prior to operation of the device, the device includes a device for positioning a movable shield device in the coating chamber adjacent the roof thereof, to reduce the formation of deposits on the roof of the coating chamber.

25 Claims, 4 Drawing Sheets

DEVICE AND METHOD FOR FORMING A COATING BY PYROLYSIS

BACKGROUND OF THE INVENTION

1. Field of the invention

The present invention relates to a device for the formation, by pyrolysis, of a coating of metal or metal compound on one face of a moving hot glass substrate by bringing said face into contact with a gaseous reagent, comprising support means for conveying the substrate through a coating chamber, at least one reagent gas inlet for supplying and distributing reagent gas to the coating chamber and at least one exhaust gas outlet for discharging exhaust gas from the coating chamber, and also to a method for forming a coating of metal or metal compound on a moving hot glass substrate by pyrolysis of a reagent in the gaseous phase.

The coating of metal or metal compound formed on a hot glass substrate by pyrolysis is used for modifying the apparent colour of the glass and/or presenting other properties required vis-à-vis incident radiation, for example the property of reflecting infrared. A single coating on the glass substrate may be used for these purposes, or a multi-layer coating. Examples would be coatings of tin oxide $SnO_2$, tin oxide $SnO_2$ doped with fluorine, titanium dioxide $TiO_2$, titanium nitride TiN, silicon nitride $Si_3N_4$, silica $SiO_2$ or $SiO_x$, alumina $Al_2O_3$, vanadium pentoxide $V_2O_5$ or tungsten oxide $WO_3$ or molybdenum oxide $MoO_3$, and in general oxides, sulfides, nitrides or carbides and a layering of two or more of these coatings.

The coating can be formed on a sheet of glass which moves in a tunnel oven or on a glass ribbon during formation, whilst it is still hot. The coating can be formed inside the lehr which follows the glass ribbon forming device or inside the float tank on the top face of the glass ribbon whilst the latter is floating on a bath of molten tin.

2. Description of the Related Art

To form the coating, the substrate is brought into contact, in a coating chamber, with a gaseous medium comprising one or more substances in the gaseous phase. The coating chamber is fed with a reagent gas through one or more slots, the length of which is at least equal to the width to be coated, fed through one or more ejection nozzles. Depending on the type of coating to be formed and the reactivity of the substances used, if several substances have to be used, these are distributed either in the form of a mixture by a single ejection nozzle in the coating chamber via a slot, or separately by several ejection nozzles via separate slots.

Methods and devices for forming such a coating are described for example in French patent No 2 348 166 (BFG Glassgroup) or in French patent application No 2 648 453 A1 (Glaverbel). These methods and devices lead to the formation of particularly strong coatings with advantageous optical properties.

While such devices may be capable of forming coatings of acceptable quality, it is a disadvantage of such devices that some coating material is spuriously deposited on other surfaces adjacent the coating chamber, in particular on the roof thereof and that over time such deposits may build up and disturb the flow of reagent gas through the coating chamber thereby resulting in uneven coating or may even fall onto the glass surface thereby resulting in even more serious defects.

SUMMARY OF THE INVENTION

It is an object of the present invention to provide a device and method in which the avoidance of the aforesaid disadvantage is facilitated.

We have discovered that this objective can be achieved by the provision of a movable shield in the coating chamber.

Thus, according to the invention, there is provided a device for the formation, by pyrolysis, of a coating of metal or metal compound on one face of a moving hot glass substrate by bringing the face into contact with a gaseous reagent, comprising support means for conveying the substrate through a coating chamber, at least one reagent gas inlet in the form of a slot opening directly into the coating chamber and extending transverse to the path of the substrate for supplying and distributing reagent gas to the coating chamber and at least one exhaust gas outlet for discharging exhaust gas from the coating chamber, characterised by the provision of movable shield means positioned in the coating chamber adjacent the roof thereof, to reduce the formation of deposits on the coating chamber roof.

The device according to the invention is a simple device which enables the continuous deposit of a coating on a ribbon of glass with minimum fouling of the coating chamber roof, thereby providing an advantage in terms of shut-down time required for cleaning and consequently improving the productivity of the device. It is surprising that the introduction of movable shield means in the coating chamber does not disturb the coating process. This is particularly true when the coating chamber roof is close to the glass substrate, as is generally the case with CVD processes.

The device preferably further comprises means for moving the shield means into and out of the coating chamber, thereby avoiding the need to move the shield means by hand.

In one embodiment of the invention, the shield means comprises a plurality of cables extending across the coating chamber transversely of the direction of movement of the hot glass substrate. When a plurality of cables is used as the shield means, the diameter of the cables and their relative spacing is an important factor in successfully screening the coating chamber roof from the reagent gas. We prefer that the diameter of the cables should correspond to from 20% to 60% of the distance ($\Delta$) between the coating surface and the roof of the coating chamber and are spaced apart by a distance equivalent to between 1 and 5 times $\Delta$.

In a modification of this embodiment, the shield means is comprised by smooth bars extending across the width of the coating chamber and being movable into and out of the coating chamber for cleaning purposes. Although it may be easier to remove deposited material from smooth bars compared with cables, bars are more difficult to keep straight under the high temperature conditions prevailing in the coating chamber.

In a further modification, the shield means is comprised by a belt, made for example of steel mesh, extending across the coating chamber transversely of the direction of movement of the hot glass substrate.

The device preferably includes cleaning means positioned outside the coating chamber for removing deposits from the shield means. Thus in use, any stray deposits which are formed on the shield means can be removed therefrom by the cleaning means enabling the shield means to be returned, in a clean state, to the coating chamber.

Most preferably, the cleaning means comprises a cooling chamber and guide means to cause the shield means to pass therethrough. The temperature in the coating chamber may be, for example, about 600° C. By rapidly cooling the shield means, the thermal shock thereby imparted can be sufficient to cause any adhered coating material to be dislodged therefrom, thereby effectively cleaning the shield means. This is a particularly advantageous method of cleaning when the shield means is in the form of cables. The cooling chamber may include a water jacket or may be in the form of a water reservoir through which the shield means passes.

As an alternative or additional method of cleaning, the shield means is brought into contact with a cleaning device, such as a brush or scraper, positioned outside the coating chamber for removing deposits from the shield means.

The use of cables, a belt or other flexible element as the shield means enables the shield means to be tensioned so as to ensure that it lies in a straight, predetermined plane, which is preferably parallel to both the substrate surface and the coating chamber roof. Thus in a preferred embodiment of the invention, the shield means comprises a flexible element and means for the tensioning thereof in the coating chamber.

The flexible element may be in the form of a continuous loop which is driven constantly as the coating process continues.

The device may include means for moving the shield means into and out of the coating chamber, and thereby into and out of the cleaning means positioned outside the coating chamber. In the case of cables, motor-driven pulleys may be provided for this purpose. In the case of a belt, a motor-driven rollers may be used.

In an alternative embodiment, the shield means is comprised by a moving curtain of inert gas adjacent the roof of the coating chamber. In particular, the curtain of inert gas flows in the same direction as the flow of reagent gas in the coating chamber.

The curtain of inert gas may generally suppress the formation of deposits. The use of an inert gas curtain is advantageous in that it does not require the presence of movable mechanical elements. It is indeed surprising that the addition of a current of gas into the coating chamber does not reduce the efficiency of the coating process.

By the term "inert gas" we mean a gas which does not significantly affect the reaction of the reagent gas at the surface of the substrate and will usually be selected from nitrogen, carbon dioxide, argon and mixtures thereof. The inert gas is preferably dry, since any water vapour present may react with the reagent gas, depending upon the nature of the latter.

The flow of inert gas through the coating chamber should generally be parallel to the flow of reagent gas and should be such as to avoid significant mixing with the reagent gas, so that the inert gas effectively forms a curtain, shielding the reagent gas from the coating chamber roof. Nevertheless, some mixing of the inert gas and the reagent gas will inevitably occur at their mutual boundary. We have found that a relatively cold curtain of gas, having for example a temperature of below about 400° C. as it enters the coating chamber, is effective, with an inert gas flow rate of from 0.4 to 1.5 Nm$^3$/cm.h, such as about 0.7 m$^3$/cm width of substrate/hr.

The inert gas may be injected into the coating chamber by way of a plurality of inlet vents in the coating chamber roof and exhausted therefrom through the exhaust gas outlet. This may be achieved according to an embodiment of the invention, in that the device comprises an inert gas supply chamber, the coating chamber roof being provided with a plurality of inert gas vents connecting with the inert gas supply chamber and opening into the coating chamber. A spacing between the inlet vents of from 5 to 70 mm has been found to be suitable. It is preferable to make this space as small as possible, such as from 5 mm to 20 mm.

In place of the vents referred to above, the coating chamber may be provided with porous roof members separating the coating chamber from the inert gas supply chamber, this construction providing a particular simple manner of achieving uniform injection of the inert gas.

The flow rate of the inert gas through the coating chamber is preferably controlled by the use a variable speed pump and/or by the provision of a variable gas restrictor valve in the inert gas circuit.

We have found it particularly advantageous to combine the different embodiments of the shield means, that is by the use of both moving cables and a curtain of inert gas fed through porous roof members into the coating chamber.

The invention also provides a method for the formation, by pyrolysis, of a coating of metal or metal compound on one face of a moving hot glass substrate by bringing the face into contact with a gaseous reagent, comprising:

conveying the substrate through a coating chamber;

supplying and distributing reagent gas to the coating chamber by means of at least one reagent gas inlet in the form of a slot opening directly into the coating chamber and extending transverse to the path of the substrate; and discharging exhaust gas from the coating chamber, characterised by moving shield means in the coating chamber adjacent the roof thereof, to reduce the formation of deposits on the coating chamber roof.

The reagent gas inlet or inlets preferably includes an ejection nozzle having a slot opening directly into the coating chamber, the slot extending transverse to the path of the substrate, the length of said slot being at least substantially equal to the coating width of the substrate (that is, to the width of that part of the substrate which it is desired to be coated). In one embodiment of the invention, the slot is formed by a longitudinal distributor, the longitudinal internal walls of which are substantially parallel to each other and form, with the plane of movement of the substrate, an angle of between 20° and 40°.

The axial plane of the nozzle may be inclined at an angle of between 20° and 40° to the plane of movement of the substrate. Preferably, the axial plane of the nozzle is substantially perpendicular to the plane of movement of the substrate to avoid overcrowding.

Two types of installation have been developed, allowing the continuous in-line formation of a coating by the pyrolysis of a reagent or reagents in the vapour phase (CVD) on a ribbon of hot glass manufactured by the float process. The two types of installation for depositing a coating may be described as an asymmetrical installation and a symmetrical installation.

An asymmetrical installation has already been described in patents specifications GB 1524326 and GB 2033374 (BFG Glassgroup), whilst a symmetrical installation was described in patent specifications GB 2234264 and GB 2247691 (Glaverbel).

Both types of installation can be placed above the glass ribbon after it emerges from the float tank or over the glass whilst it is still in the float tank.

They enable substantially the entire width of the glass ribbon, e.g. approximately 3.20 m, to be covered.

These installations may be removable. They can therefore be put in position to produce coated glass and withdrawn whenever necessary.

A system for the deposition of a layer in a float tank may include means to ensure accurate geometry and functioning even at the high temperatures which prevail in a float tank. The coating depositing device may be coupled to a bogie carrying a plurality of rollers adapted to engage fixed guide beams. Preferably, the device further comprises means to adjust the height of the coating chamber above the glass substrate. Thus, rams may be provided to enable the distance between the glass and the CVD coating chamber to be adjusted to a distance which is generally less than 50 mm (preferably between 3 and 30 mm).

The float tank may be sealed, at the point where the device passes, by means of a bellows system.

BRIEF DESCRIPTION OF THE DRAWINGS

The invention will now be illustrated by reference to the accompanying drawings in which.

DESCRIPTION OF THE PREFERRED EMBODIMENTS

Figure 1:
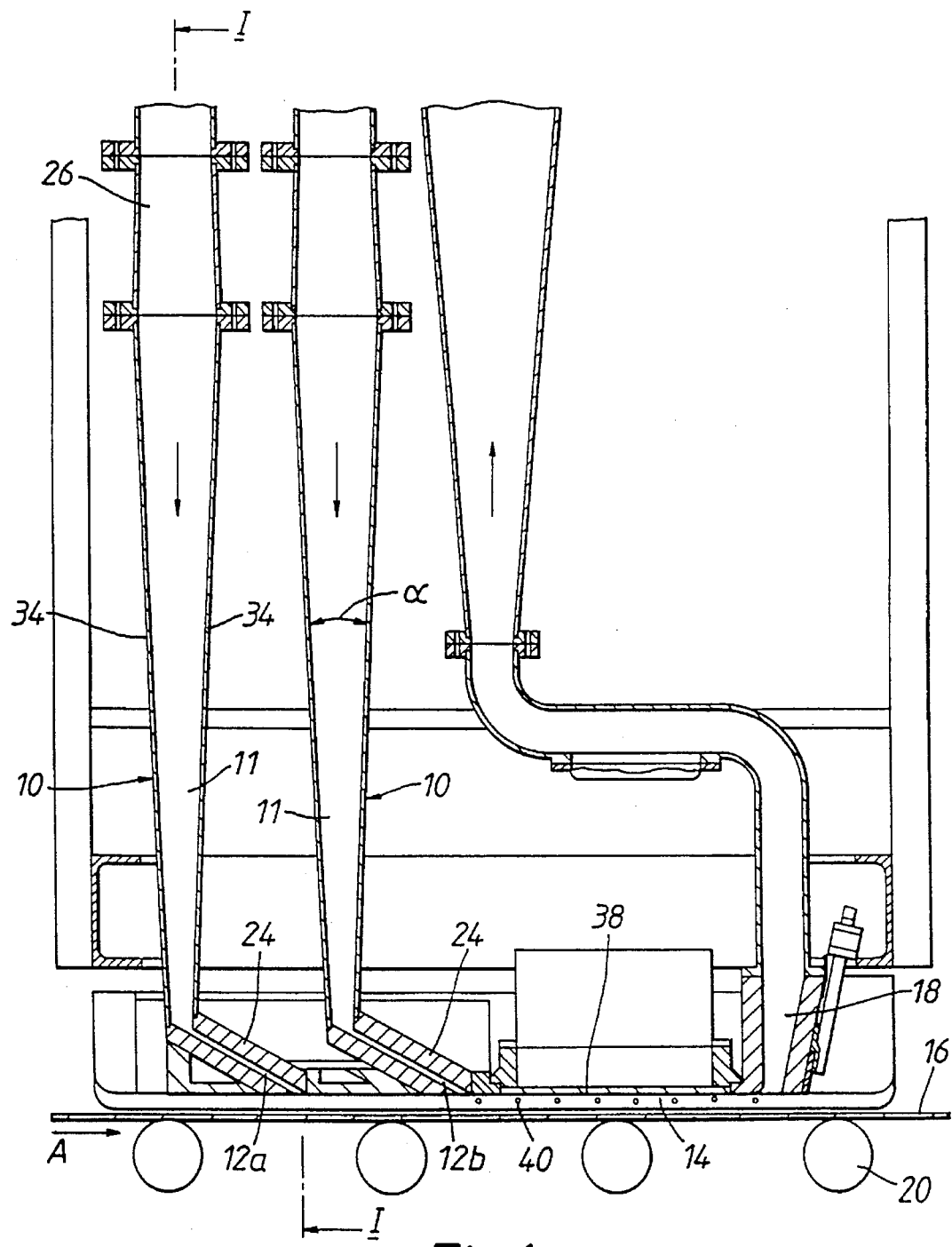
FIG. 1 shows in vertical cross-section an asymmetrical installation according to the invention.
Figure 1A:
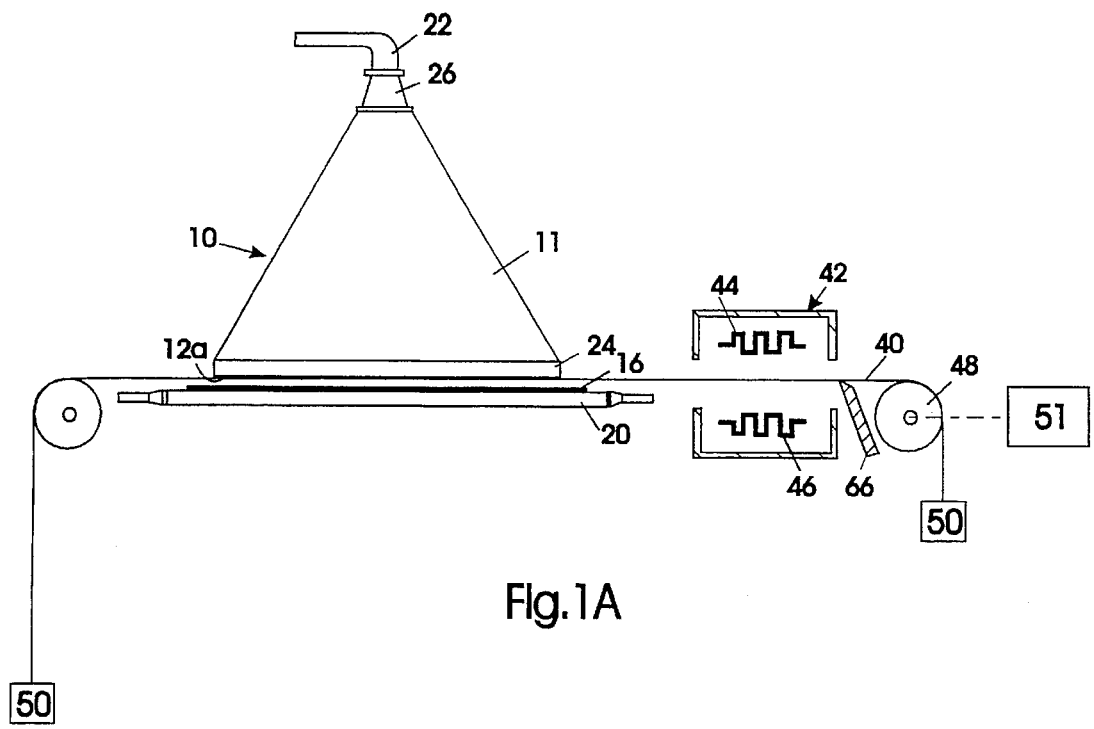
FIG. 1A is a diagrammatic cross-section taken along the line I—I in FIG. 1.

FIGS. 1 and 1A show the whole of an asymmetrical installation which comprises three main parts:

(i) two vaporised or gaseous reagent ejection nozzles 10, each having a height of 85 cm and incorporating a slot 12a, 12b, each slot having a gas flow path of 15 cm, an opening dimension of 8 mm and a spacing between the slot walls of 4 mm;

(ii) a coating chamber 14, consisting of a flat vault defining a channel open towards the bottom, above the glass 16; and (iii) a slot 18 for extracting the used vapours.

The ribbon of glass 16 is supported by rollers 20 and driven in the direction indicated by the arrow A.

The flow of the vapours in the coating chamber 14 along the glass 16 is mainly controlled by suction.

When hot reagents have to be brought into contact with the glass 16 at a point located outside the float tank, the whole installation is preferably insulated.

The number of successive reagent supply slots 12a,b depends on the nature of the coating to be formed. These slots 12a,b are inclined towards the coating chamber 14.

This device can be placed over the glass 16 so that the reagents flow in the direction of movement A of the ribbon or in the opposite direction.

The supply means for the gaseous reactants are constituted by a delivery pipe 22 connected to an adapter 26 which leads into the nozzle 10.

The vault or roof 38 of the coating chamber 14 is at a distance (Δ) of 20 mm from the glass 16. The width of each of the slots 12a and 12b is 4 mm. The length of the coating chamber 14 is chosen so that the reagent remains in contact with the glass 16 for 6 to 10 seconds. In practice, the length of the coating chamber 14 is chosen once and for all, according to the most usual speed of travel of the glass 16—i.e. about 14 m/min for 4 mm glass—and the concentration of reagent is adjusted whenever necessary according to the nature and thickness of the coating to be obtained.

The installation is sealed by means of carbon fibre joints (especially when the installation is situated in a float tank) or by REFRASIL (Trade Mark) or CERAFELT (Trade Mark) skirts.

REFRASIL and CERAFELT are high temperature insulating cloths. REFRASIL is a textile made of filaments of amorphous silica. CERAFELT is a felt made of refractory fibers of a formulation including alumina, silica, and zirconia.

To prevent fouling of the coating chamber 14 by stray deposits which may fall on the glass 16 and create defects in the coating formed on it, the installation includes a system for trapping stray deposits. A number of metal cables 40, made from stainless steel, are disposed underneath the vault 38 of the coating chamber 14. These cables preferentially collect the solid material which forms above the glass 16 and divert the gas currents away from the vault, which remains clean. The cables move transversely as the glass 16 travels, thus making it possible to withdraw the fouled part progressively and replace it with a clean part.

The installation is formed from annealed metal pieces fixed to each other by bolts rather than welding to avoid thermal distortion.

Referring to FIG. 1A, it can be seen that each metal cable 40 passes through a cooling chamber 42 positioned outside the coating chamber 14. The cooling chamber 42 comprises upper and lower cooling coils 44, 46, through which a cooling fluid, such as water at room temperature, flows. On exiting the cooling chamber 42, each cable passes over a motor-driven pulley 48 driven by motor 51. A tensioning device, for example, counterweight 50, applies tension to the cable 40, to ensure that the latter has a straight path through the coating chamber 14, parallel to both the coating surface of the glass substrate 16 and to the coating chamber roof 38. The tensioning device 50 may be in the form of counterweights 50 on either side of the ribbon of glass.

Although not shown in FIG. 1A, similar cooling chambers may be provided on the other side of the coating chamber 14, enabling the cable to be moved first in one direction through the coating chamber and then in the reverse direction, the extent of movement in each direction being sufficient to ensure that all of the cable which passes through the coating chamber is subsequently passed through one or both cooling chambers. We prefer however to use a closed loop of cable, thereby enabling movement in one direction only, there then being a need for only one motor-driven pulley and tensioning device for each cable.

In place of the cooling chamber 42, the cables 40 may pass through a water bath, where direct contact with the water therein generates the required thermal shock to dislodge the deposited material.

Figure 1C:
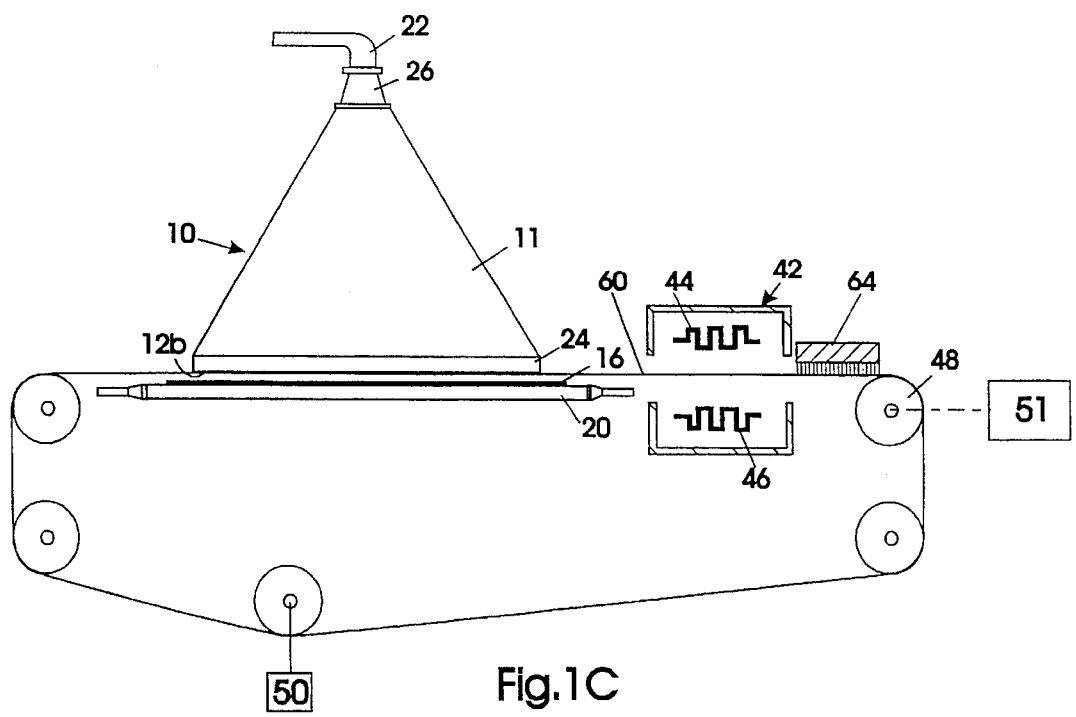
FIG. 1C is a diagrammatic cross-section taken along the line II—II in FIG. 1B.
Figure 1B:
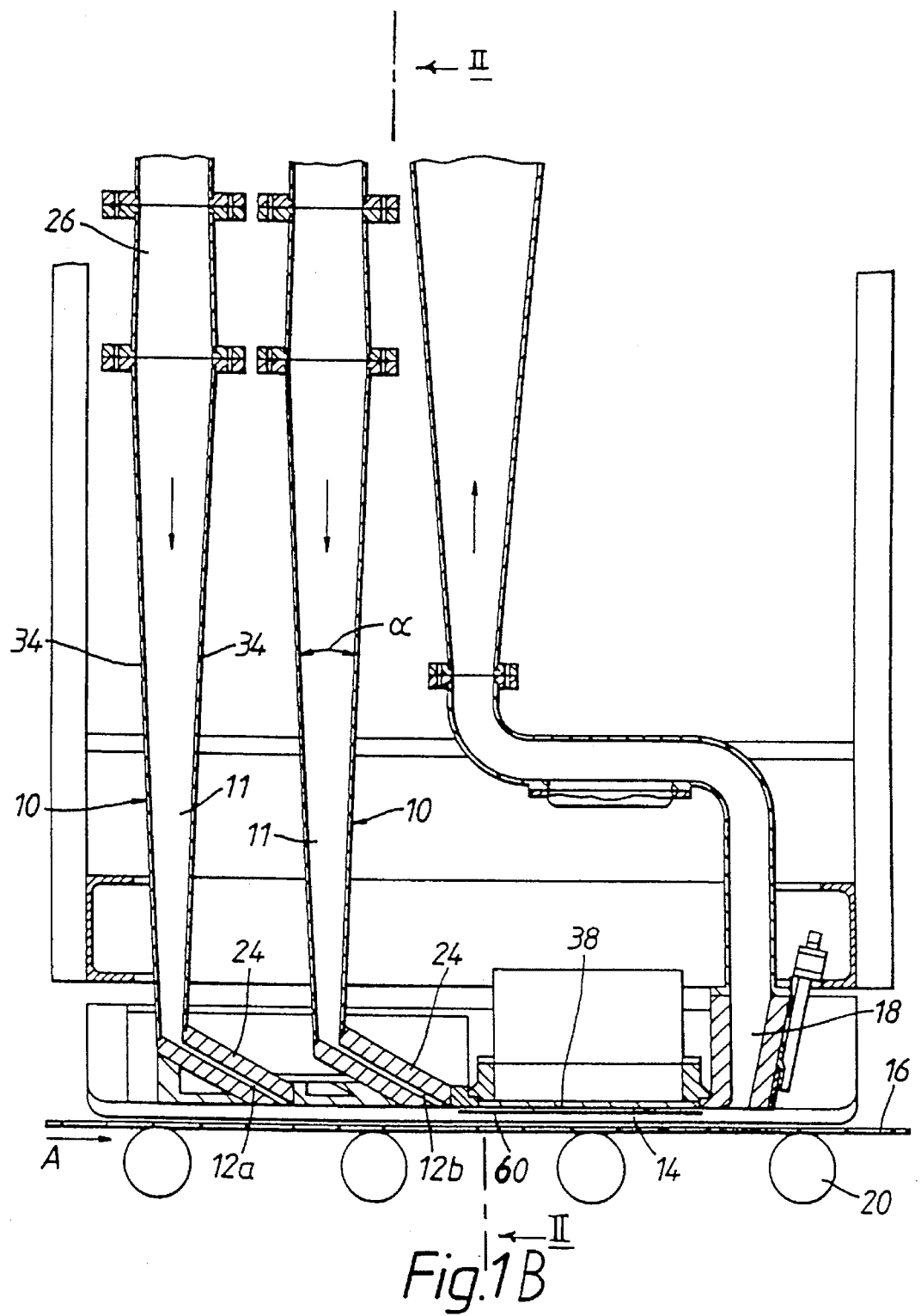
FIG. 1B shows in vertical cross-section an alternative asymmetrical installation according to the invention.

In alternatives of the construction shown in FIGS. 1 and 1A, the cables 40 may be replaced by an endless steel mesh or steel band belt 60 in FIGS. 1B and 1C or by smooth steel bars. The belt 60 may be provided with a cleaning device, for example, a brush 64 (see FIG. 1C) or a scraper 66 (see FIG. 1A) for removing deposits from belt 60.

Figure 2:
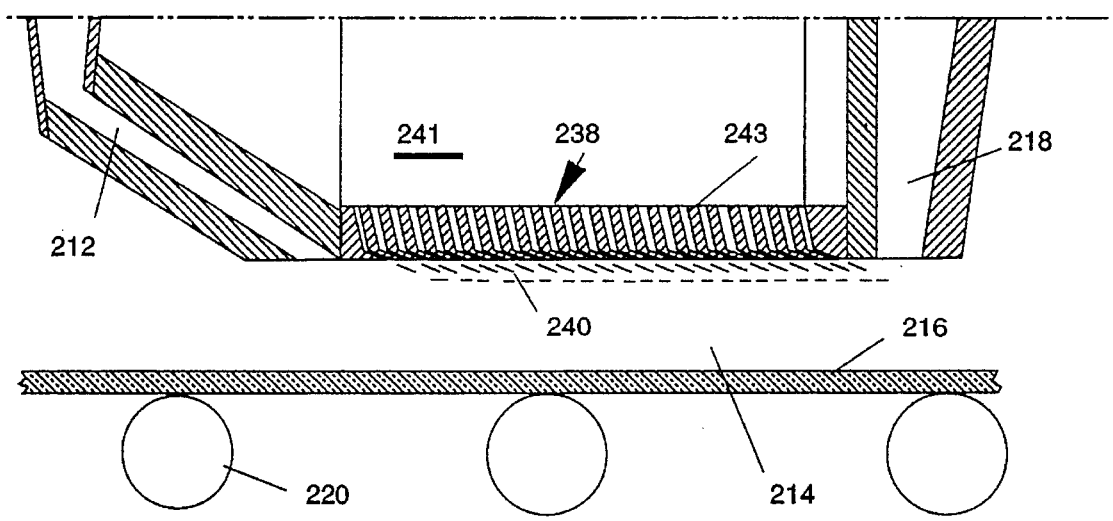
FIG. 2 shows in vertical cross-section part of an alternative asymmetrical installation according to the invention.

In the embodiment shown in FIG. 2, a ribbon of glass 216 is supported on rollers 220 and the device includes shield means comprised by a moving curtain of nitrogen adjacent the roof of the coating chamber. The roof 238 of the coating chamber 214 is formed with a plurality of nitrogen inlet vents 243 which lead from a nitrogen supply chamber 241. The vents 243 each have an opening dimension of 2 mm and are spaced from each other by 2 cm. The vents are angled in the direction of the flow of reagent gas through the coating chamber 214 from the reagent gas inlet nozzle 212. Thus the nitrogen passing through the vents 243 is caused to flow through the coating chamber 214 in the same direction as the reagent gas. Nitrogen is fed to the supply chamber 241 at room temperature at a flow rate of about 0.7 Nm$^3$/cm width of substrate/hr. Since the apparatus is at an elevated temperature, the temperature of the nitrogen rises, up to about 300° C. as it enters the coating chamber 214. Nevertheless, the nitrogen is at a temperature in the coating chamber 214 which is less than that of the reagent gas. The nitrogen forms a curtain 240 which separates the reagent gas from the roof 238 of the coating chamber 214. Both the reagent gas and the nitrogen exit the coating chamber through the exhaust gas outlet 218.

Figure 2A:
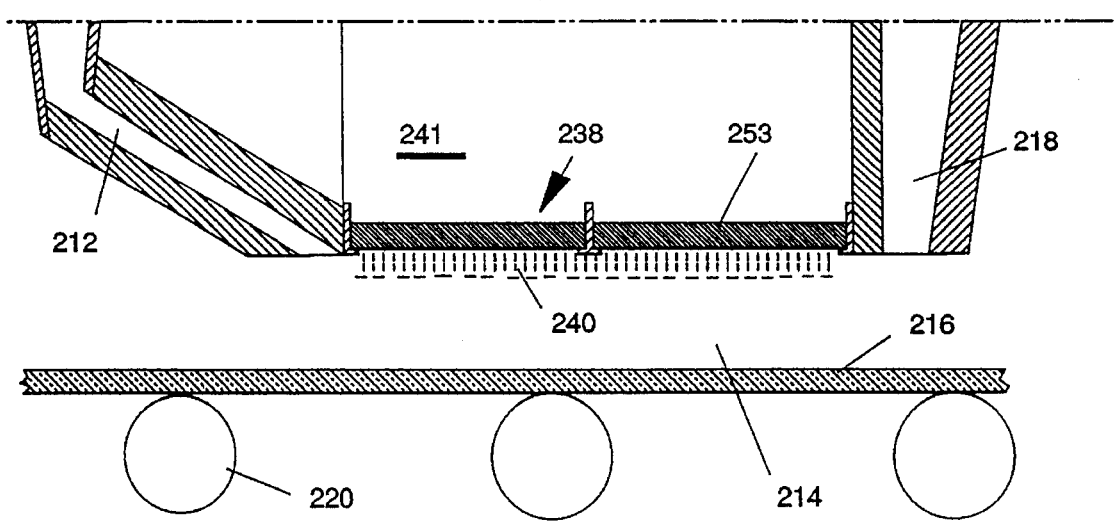
FIG. 2A shows in vertical cross-section part of a third alternative asymmetrical installation according to the invention.

In an alternative embodiment, the vents 243 may be replaced by porous metal roof members 253 for the coating chamber as shown in FIG. 2A.

We have found it particularly advantageous to combine the features of FIGS. 1 and 2, that is by the use of both moving cables and a curtain of nitrogen fed through porous roof members into the coating chamber.

EXAMPLE

The following Example illustrates the use of an asymmetrical installation such as described in connection with FIGS. 1 and 1A. This installation enables one to deposit, for example, coatings of tin oxide $SnO_2$, tin oxide $SnO_2$ doped with fluorine, titanium dioxide $TiO_2$, titanium nitride TiN, silicon nitride $Si_3N_4$ and, in general terms, oxides, sulphides, nitrides or carbides.

To form coatings of tin oxide $SnO_2$ or titanium dioxide $TiO_2$, two successive slots 12a, 12b are used. The reagent carrying the metal (Sn or Ti) (fed in at the first slot 12a) is a tetrachloride, liquid at ambient temperature, vaporised in a current of anhydrous carrier nitrogen gas at about 600° C. Vaporisation is facilitated by the atomisation of these reagents in the carrier gas.

To produce the oxide, the molecules of tetrachloride are brought into the presence of water vapour conducted to the second slot 12b. The water vapour is superheated to about 600° C., and is also injected into a carrier gas, which is air heated to about 600° C. $SnO_2$ may be formed for example using the proportions of $SnCl_4$ and $H_2O$ given in British patent specification GB 2026454 (Glaverbel).

In the case of the formation of conductive tin oxide $SnO_2$, the dopant is fluorine: HF is added to the water vapour. The HF partial pressure is $pHF=0.2\ pSnCl_4$. Another dopant can also be introduced: liquid antimony chloride $SbCl_5$ which is directly mixed with the tin chloride $SnCl_4$, with which it is miscible in any proportions. The presence of the antimony chloride $SbCl_5$, makes it possible to colour the coating of tin oxide $SnO_2$, which can then absorb (and reflect) some of the near solar infrared radiation.

The flow rate of gas (carrier gas+ reagent) in each slot 12 is 1 m$^3$/cm of slot/hr, at the operating temperature.

To deposit coatings of tin oxide $SnO_2$ or titanium dioxide $TiO_2$, INCONEL 600 or optionally an even more refractory alloy (HASTELLOY) is chosen for the parts of the device which are in contact with tin chloride $SnCl_4$ or titanium chloride $TiCl_4$ and MONEL for the water vapour and HF slot. INCONEL identifies nickel alloys and, for example, INCONEL 600 is composed mainly of 75% Ni, 15.5% Cr, and 8% Fe. HASTELLOY is a nickel alloy resistant to oxidizing conditions at high temperature and, for example, HASTELLOY C is composed of 54% Ni, 17% Mo, 15% Cr, 5% Fe, and 4% W. MONEL identifies nickel alloys and, for example, MONEL 400 is composed of 65% Ni, 32% Cu, 1.5% Fe, and 1% Mn.

The cables 40 have a diameter of 8 mm and are spaced apart in mutually parallel relationship by 50 mm. They are positioned close to the roof 38 of the coating chamber 14 and are subjected to a tension of two counterweights, one on each side, of 15 kg weight each, to ensure their straight and parallel disposition. It is recommended to take precautions to avoid shocks to the cables during their movements, in order to avoid the dislodgement of material which has become deposited on the surface of the cables, which would generate faults in the coating formed on the glass. The cables are driven through the coating chamber at a rate of 1 m/sec, while the substrate moves at rate of 10 m/min.

The fouling of the roof of the coating chamber during operation of the device is low, thereby reducing the need to stop the device for cleaning purposes.

What is claimed is:

1. A device for the formation, by pyrolysis, of a coating of metal or a metal compound on a face of a hot glass substrate which is in motion by bringing the face into contact with a gaseous reagent, comprising:

a roof;

support means for conveying the hot glass substrate along a path through a coating chamber defined between the roof and the face of the hot glass substrate;

at least one reagent gas inlet in the form of a slot opening directly into the coating chamber and extending transverse to the path of the hot glass substrate for supplying and distributing gaseous reagent to the coating chamber;

at least one exhaust gas outlet for discharging exhaust gas from the coating chamber; and a movable shield means positioned in the coating chamber adjacent the roof and a means for positioning the movable shield means in the coating chamber adjacent the roof, to reduce the formation of deposits on the roof.

2. The device according to claim 1, wherein the means for positioning the movable shield means comprises means for moving the movable shield means into and out of position within the coating chamber.

3. The device according to claim 1, wherein the movable shield means comprises a flexible element provided in the coating chamber and means for tensioning the flexible element.

4. The device according to claim 3, wherein the flexible element is comprised of at least one cable extending across the coating chamber transversely to the path of the hot glass substrate.

5. The device according to claim 1, wherein the movable shield means is comprised of a belt extending across the coating chamber transversely to the path of the hot glass substrate.

6. The device according to claim 1, further comprising cleaning means positioned outside the coating chamber for removing deposits from the movable shield means.

7. The device according to claim 6, wherein the cleaning means comprises a cooling chamber and guide means for moving the movable shield means through the cooling chamber.

8. The device according to claim 6, wherein the cleaning means comprises a cleaning device in contact with the movable shield means.

9. The device according to claim 8, wherein the cleaning device comprises one of a brush or scraper.

10. The device according to claim 1, wherein the roof is positioned at a distance of less than 50 mm from the face of the hot glass substrate to be coated.

11. The device according to claim 10, wherein the roof is positioned at a distance ranging between 3 and 30 mm from the face of the hot glass substrate to be coated.

12. A device for the formation, by pyrolysis, of a coating of metal or a metal compound on a face of a hot glass substrate which is in motion by bringing the face into contact with a gaseous reagent, comprising:

a roof;

support means for conveying the hot glass substrate along a path through a coating chamber defined between the roof and the face of the hot glass substrate;

at least one reagent gas inlet in the form of a slot opening directly into the coating chamber and extending transverse to the path of the hot glass substrate for supplying and distributing gaseous reagent to the coating chamber;

at least one exhaust gas outlet for discharging exhaust gas from the coating chamber; and means for providing a movable shield means in the coating chamber adjacent the roof, to reduce the formation of deposits on the roof.

13. The device according to claim 1, wherein the means for providing a movable shield means comprises means for providing a moving curtain of inert gas adjacent the roof of the coating chamber.

14. The device according to claim 13, wherein the gaseous reagent is a flow having a direction, and wherein the moving curtain of inert gas flows in the same direction as the flow of gaseous reagent in the coating chamber.

15. The device according to claim 10, wherein the means for providing a moving curtain of inert gas comprises an inert gas supply chamber and a plurality of inert gas vents provided in the roof in connection with the inert gas supply chamber, and opening into the coating chamber.

16. The device according to claim 13, wherein the means for providing a moving curtain of inert gas comprises an inert gas supply chamber and porous roof members provided in the roof in connection with the inert gas supply chamber, and opening into the coating chamber.

17. A method for the formation, by pyrolysis, of a coating of metal or a metal compound on a face of a hot glass substrate which is conveyed by a support means along a path under a roof by bringing the face into contact with a gaseous reagent, comprising:

(a) conveying the hot glass substrate through a coating chamber defined between the roof and face of the hot glass substrate;

(b) supplying and distributing the gaseous reagent to the coating chamber by means of at least one reagent gas inlet in the form of a slot which opens directly into the coating chamber and which extends transverse to the path of the hot glass substrate;

(c) discharging exhaust gas including used vapors of the gaseous reagent from the coating chamber; and (d) providing a movable shield means in the coating chamber adjacent the roof, to reduce the formation of deposits on the roof.

18. The method according to claim 17, further comprising moving the movable shield means into and out of the coating chamber.

19. The method according to claim 17, further comprising cleaning the movable shield means by cleaning means positioned outside the coating chamber.

20. The method according to claim 19, wherein the cleaning means comprises a cooling chamber and passes through the cooling chamber.

21. The method according to claim 19, wherein the cleaning means is a cleaning device, and wherein the movable shield means is brought into contact with the cleaning device to remove deposits therefrom.

22. The method according to claim 17, wherein the movable shield means comprises means for providing a curtain of inert gas which is moved adjacent to the roof, to reduce the formation of deposits on the roof.

23. The method according to claim 22, wherein the gaseous reagent is a flow having a direction, and wherein the curtain of inert gas is caused to flow in the same direction as the flow of gaseous reagent in the coating chamber.

24. The method according to claim 17, wherein the roof is positioned at a distance of less than 50 mm from the face of the hot glass substrate to be coated.

25. The method according to claim 24, wherein the roof is positioned at a distance ranging between 3 and 30 mm from the face of the hot glass substrate to be coated.

* * * * *